(12) United States Patent
Panpalia et al.

(10) Patent No.: US 7,231,012 B2
(45) Date of Patent: Jun. 12, 2007

(54) PROGRAMMABLE FREQUENCY DIVIDER

(75) Inventors: Ashish Panpalia, Wardha (IN); Puneet Sareen, Rohini (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 0 days.

(21) Appl. No.: 11/291,071

(22) Filed: Nov. 29, 2005

(65) Prior Publication Data

US 2006/0203954 A1    Sep. 14, 2006

(30) Foreign Application Priority Data

Nov. 30, 2004  (IN) .................. 2399/DEL/2004

(51) Int. Cl.
*H03K 21/00*    (2006.01)
(52) U.S. Cl. .......................................... 377/47; 377/44
(58) Field of Classification Search ................ 327/112, 327/113, 117; 377/47–48, 52, 118
See application file for complete search history.

(56) References Cited

U.S. PATENT DOCUMENTS

| | | | | |
|---|---|---|---|---|
| 4,975,931 A * | 12/1990 | Cosand | ......................... | 377/52 |
| 5,396,109 A * | 3/1995 | Oshiba | ....................... | 327/233 |
| 5,694,089 A * | 12/1997 | Adachi et al. | ................. | 331/16 |
| 6,114,915 A | 9/2000 | Huang et al. | | |
| 6,236,278 B1 * | 5/2001 | Olgaard | ....................... | 331/25 |
| 6,445,760 B1 * | 9/2002 | Weintraub et al. | ............. | 377/48 |
| 6,795,519 B2 * | 9/2004 | Chakravarthy | ................ | 377/48 |

* cited by examiner

*Primary Examiner*—Dinh T. Le
(74) *Attorney, Agent, or Firm*—Hogan & Hartson LLP (57) ABSTRACT

A programmable frequency divider capable of operating in a normal mode and a fractional mode divides the input clock frequency by any integer 'N' provided at the input. In the normal mode the input is divided by the integer 'N'. The divided output signal has a 50% duty cycle if the input clock has a 50% duty cycle. In the fractional mode, fractional division can be achieved from dividing by 1.5 to dividing by 255.5 in steps of 0.5.

19 Claims, 7 Drawing Sheets

Fig. 4 q1-q7 ⟹ outputs of the down counter
L ⟹ Load1 signal from Loadgenerator

PROGRAMMABLE FREQUENCY DIVIDER

RELATED APPLICATION

The present invention claims priority of Indian Patent Application 2399/Del/2004 filed Nov. 30, 2004, which is incorporated herein in its entirety by this reference.

FIELD OF THE INVENTION

The present invention relates to a programmable frequency divider capable of operating in a normal mode and a fractional mode.

BACKGROUND OF THE INVENTION

Frequency dividers are generally used, for example, in frequency synthesizers to provide signals in stepped frequencies. One field of application for frequency dividers are, e.g. PLL (Phase Locked Loop) circuits as used in mobile radio technology. In these circuits, a number of communication channels are only a few 100 kHz apart from one another in the GHz band, and the PLL circuit must ideally be capable of generating output frequencies, which are precisely synchronized to these channels. As a rule, a fractional frequency divider is used in the feedback path of the PLL circuits.

Another field of application for frequency dividers is, for example, digital signal processing and microprocessor technology. In the case of signal processing devices, it is often a requirement to clock different modules with different frequencies, which are a few MHz apart from one another (e.g. from 70 MHz to 170 MHz). A register or processor operating, e.g. at a maximum frequency of 152 MHz can only be operated optimally if this exact clock frequency is provided, if possible. If, e.g. only two different frequencies, for instance 120 MHz and 170 MHz, are available, one is forced to operate the processor at 120 MHz, as a result of which 32 MHz of performance are lost. Using a frequency synthesizer, which covers the range between 120 MHz and 170 MHz in 10-MHz steps, the microprocessor can be operated at 150 MHz and only 2 MHz of performance are lost.

These examples show that frequency dividers capable of dividing a predetermined input frequency not only by an integral factor N but also by fractions thereof, namely N+m/k, are required. A method for dividing frequency of a signal is disclosed in U.S. Pat. No. 6,114,915 to Altera Corporation. It includes the steps of (1) applying the signal to down counter (2) storing a first count value and a second count value in memory (3) loading the down counter the first count value (4) detecting when the down counter counts to the end of first count value (5) count value toggling the output signal when the down counter reaches end of count for the first count value (6) loading the down counter with the second count value (7) toggling the output signal when the down counter reaches end of count for the second count value and repeating steps (3) to (6).

The drawback of the aforesaid frequency divider is that it is not possible to obtain a 50% duty cycle at the output if the division factor is an odd number. This can be best understood with an example. Consider a case of divide by three operation. In this case, the memory should be loaded with the bits corresponding to the On Time and Off Time of the divided clock. In order to achieve 50% duty cycle at the output, the load bits corresponding to On Time and Off Time should be 1.5, which is not possible.

What is desired therefore, is a counter that can operate both in a normal division mode and in a fractional division mode.

SUMMARY OF THE INVENTION

The instant invention overcomes the aforementioned drawback. Further it also provides the feature of fractional division. To obviate the aforesaid drawbacks, the instant invention provides a programmable frequency divider, which divides the input clock by either an integer number or a fractional number. A further object of the invention is to provide an output clock with 50% duty cycle when the input clock has 50% duty cycle for odd divisions in the case of integral division.

The present invention provides a programmable frequency divider that, in its preferred embodiment, includes a data select block for loading the on and off counts; a counter receiving the input from said data select block for counting said count; a pulse generator coupled to said counter for generating an output clock with greater frequency than the input clock; a detection means coupled to said counter for detecting the count value; a load generator coupled to said detection circuit for generating the load signals for said counter and said detection circuit; and a flip-flop coupled to said load generator for providing a final output and for providing a feedback input to the data select block.

Preferably, the data select block includes of plurality of multiplexers, the counter is a synchronous down counter, the detection means is an end of count generator or a comparator, and the counter is a synchronous up counter.

In a preferred embodiment of the present invention, the load generator includes a D flip flop coupled to the first output of the detection means, an inverter coupled to the first output of the detection means, a first gate coupled to the output of the D flip flop and the inverter, a second gate coupled to the output of the first gate and second output of the detection means, and a third gate coupled to the output of the second gate and the reset signal. The first gate is preferably a NOR gate, the second gate is preferably a NOR gate, and the third gate is preferably a NAND gate.

A method of the present invention for dividing the frequency of an input signal includes providing a first count value and a second count value; generating a second signal of higher frequency than the input signal; applying the second signal to a counter; loading the counter with the first count value; detecting a first event when the counter counts the number of pulses of the second signal equal to said first count value; toggling the output signal on the detection of the first event; loading the counter with the second count value; detecting a second event when the counter counts the number of pulses of the second signal equal to the second count value; and toggling the output signal on the detection of the second event, thereby providing the divided output signal.

A method of the present invention for dividing the frequency of a high frequency input signal includes providing a first count value and a second count value; generating a second signal of higher frequency than the input signal; applying the second signal to a counter; loading the counter with the first count value; detecting a first event when the counter counts the number of pulses of the second signal is less/greater than the first count value by one; loading the counter with the second count value; toggling the output signal one clock cycle after the detection of the first event; initiating counting of the second count value; detecting a second event when the counter counts the number of pulses of the second signal is less/greater than the second count value by one; and toggling the output signal after the detection of the second event, thereby providing the divided output signal.

Preferably, the frequency of the clock signal is even integral multiple of the frequency of the input signal. Also preferably, the clock signal is generated by generating pulses on rising and falling edges of the input signal.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DETAILED DESCRIPTION

The invention is described using a synchronous down counter as an embodiment. However it is not limited to the same and can be worked using the up counter. Accordingly, a comparator replaces the End Of Count (EOC) generator.

Figure 1:
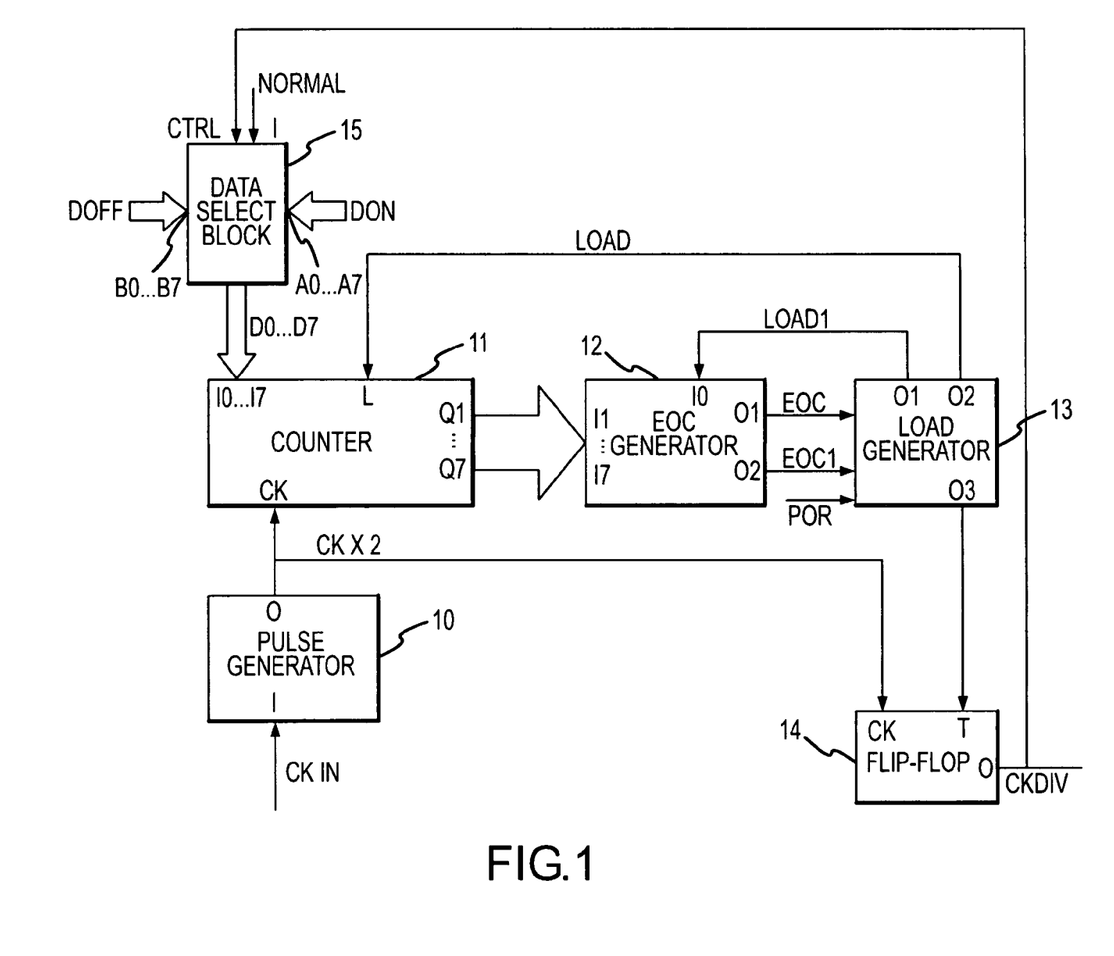
FIG. 1 shows the block diagram of a Programmable Divide by N circuit according to the present invention.

FIG. 1 shows the circuit of the programmable frequency divider in accordance with the invention. It mainly comprises six blocks namely a pulse generator 10, a synchronous down counter 11, an EOC generator 12, a load generator 13, a T Flip Flop 14 and a data select block 15. The clock input is applied to the pulse generator 10. The output of the pulse generator 10 clocks the synchronous down counter 11 and the T Flip Flop 14. The synchronous down counter 11 provides input to the EOC generator 12, which generates the signals for the load generator 13, coupled to the T flip-flop 14. The T flip-flop 14 provides the final output, which is also fed back to the data select block 15. The data select block 15 loads the count value in the synchronous down counter 11.

Figure 3:
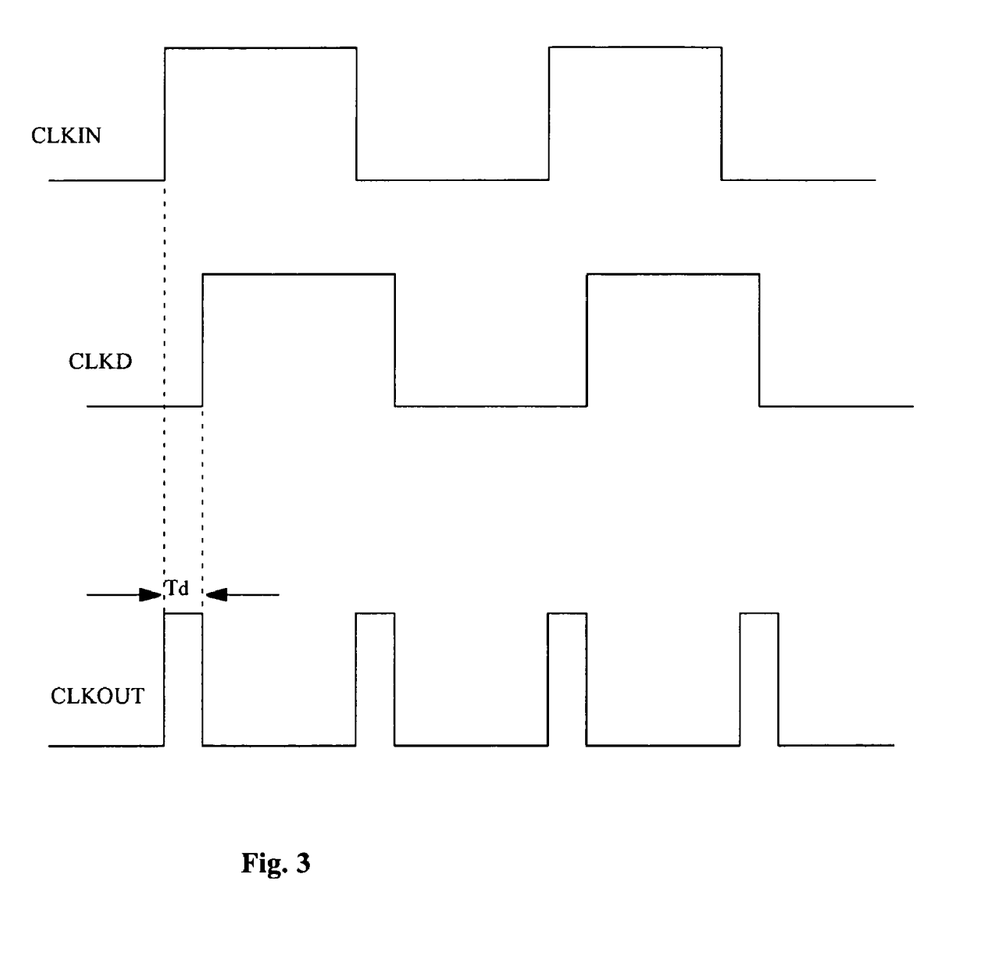
FIG. 3 shows waveforms related to the circuit of FIG. 2.

The pulse generator generates the pulses at the rising and falling edge of the input clock as shown in FIG. 3. Thus it generates the clock of double the input clock frequency. However the frequency of the clock can be further increased in even multiples of the input clock frequency. This output is given as clock to the synchronous down counter 11 and the T Flip Flop 14.

The eight-bit synchronous down counter 11 down counts the count value upon reception of the clock at its clock input. The external data D0 to D7 is loaded in the synchronous down counter 11 only when the 'L' input goes high. The outputs q1 to q7 are given to the EOC generator 12. The EOC generator 12 generates an output signal to indicate that the End Of Count has reached. It generates two signals EOC and EOC1 both of which are given to the load generator 13 that upon the reception of End Of Count generates a Load signal that is passed on to the L input of the synchronous down counter 11, which initiates the process of loading the external data on the down counter. The load generator 13 also generates the Load1 signal that is given to the I0 terminal of the EOC generator 12. The O3 output of the load generator 13 is given to the T input of the T Flip Flop 14 that provides the divided clock at the output.

The data select block 15 is a simple multiplexer circuit, which loads the data (DON or DOFF) to the synchronous down counter 11. In the case of normal mode operation, only the count value at DON terminal is passed while in the case of fractional mode the count value at either DON or DOFF is passed depending upon the state of the divided output clock.

Figure 2:
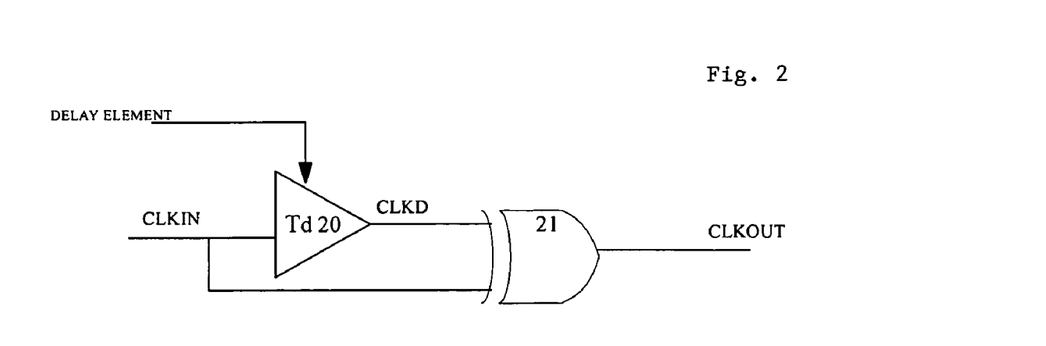
FIG. 2 shows the circuit of the Pulse Generator Block of FIG. 1.

FIG. 2 shows the pulse generator 10 along with the corresponding waveforms, which are shown in FIG. 3. It generates the pulses by XORing the input clock using the XOR gate 21 and its delayed version via delay block 20. The delay given to the clock decides the width $T_d$ of the output pulses.

Figure 4:
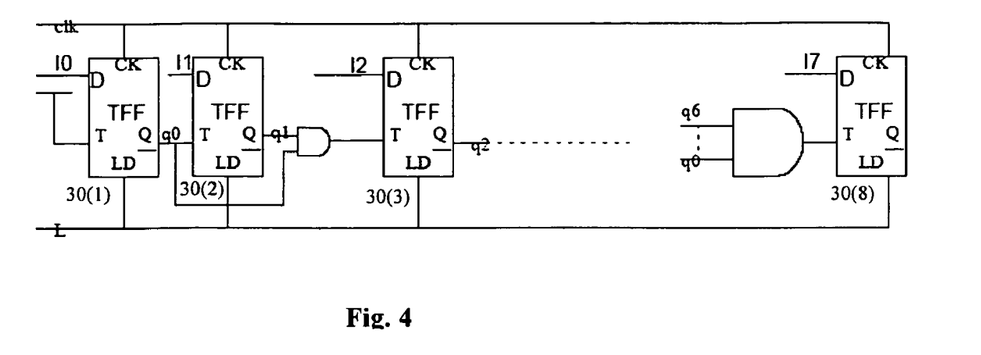
FIG. 4 shows the circuit of the Synchronous Down Counter shown in FIG. 1.

FIG. 4 shows the synchronous down counter 11 that is a simple 8 bit down counter made up of T Flip Flops 30(1)–30(8). The flip flops 30(1)–30(8) are loaded with the data at their D terminals I0 to I7 by the output of the data select block 15 when their respective load terminal LD goes high.

The synchronous down counter 11 has two modes of operation namely loading the data values and down counting the count value. When the load signal LD of the T Flip Flops 30(1)–30(8) is high, the data I0 to I7 is loaded in the synchronous down counter 11 without initiating the counting operation. As soon as the load signal (Load) goes low, the T flip-flops start toggling thereby initiating the counting operation. The inverted output of all the T flip-flops is named from q0 to q7 where q0 is the least significant bit while q7 is the most significant bit. The inverted outputs q1 to q7 are given to the EOC generator to detect the End Of Count.

Figure 5:
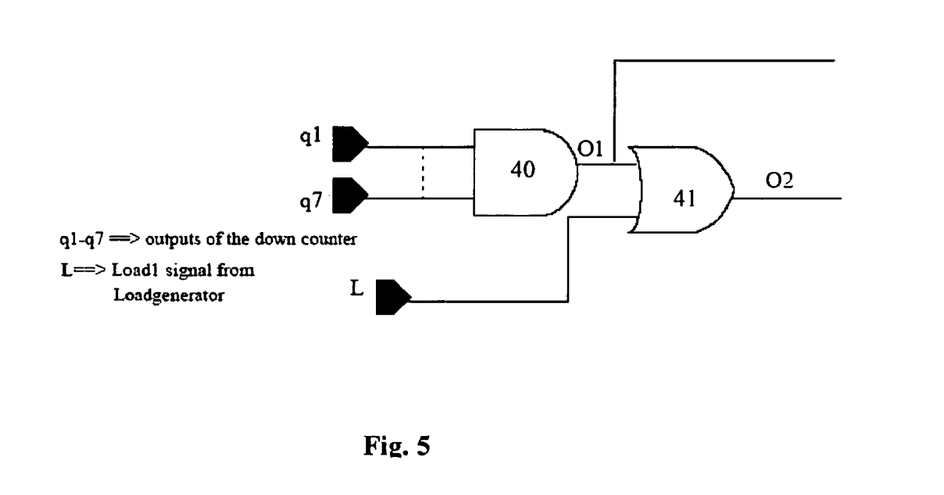
FIG. 5 shows the circuit of the EOC generator shown in FIG. 1.

FIG. 5 shows the EOC generator 12. The End of Count signal O1 (globally known as EOC) is generated by the AND gate 40 when the output of the synchronous down counter 11 is one and not zero i.e. when the state of the synchronous down counter 11 is 00000001 and not 00000000. The inputs q1 to q7 (that are the inverted output of the flip-flops) to the AND gate 40 generate logic high output when all the inputs are one. This signal goes low as soon as the output state of the synchronous down counter 11 changes.

Another signal O2 (globally known as EOC1) is generated by the OR gate 41 due to interlocking the Load1 signal from the load generator 13 and the signal O1. This signal goes high with the signal O1 but remains high for at least one clock cycle. The significance of this signal will be understood in the subsequent explanation for the load generator 13.

Figure 6:
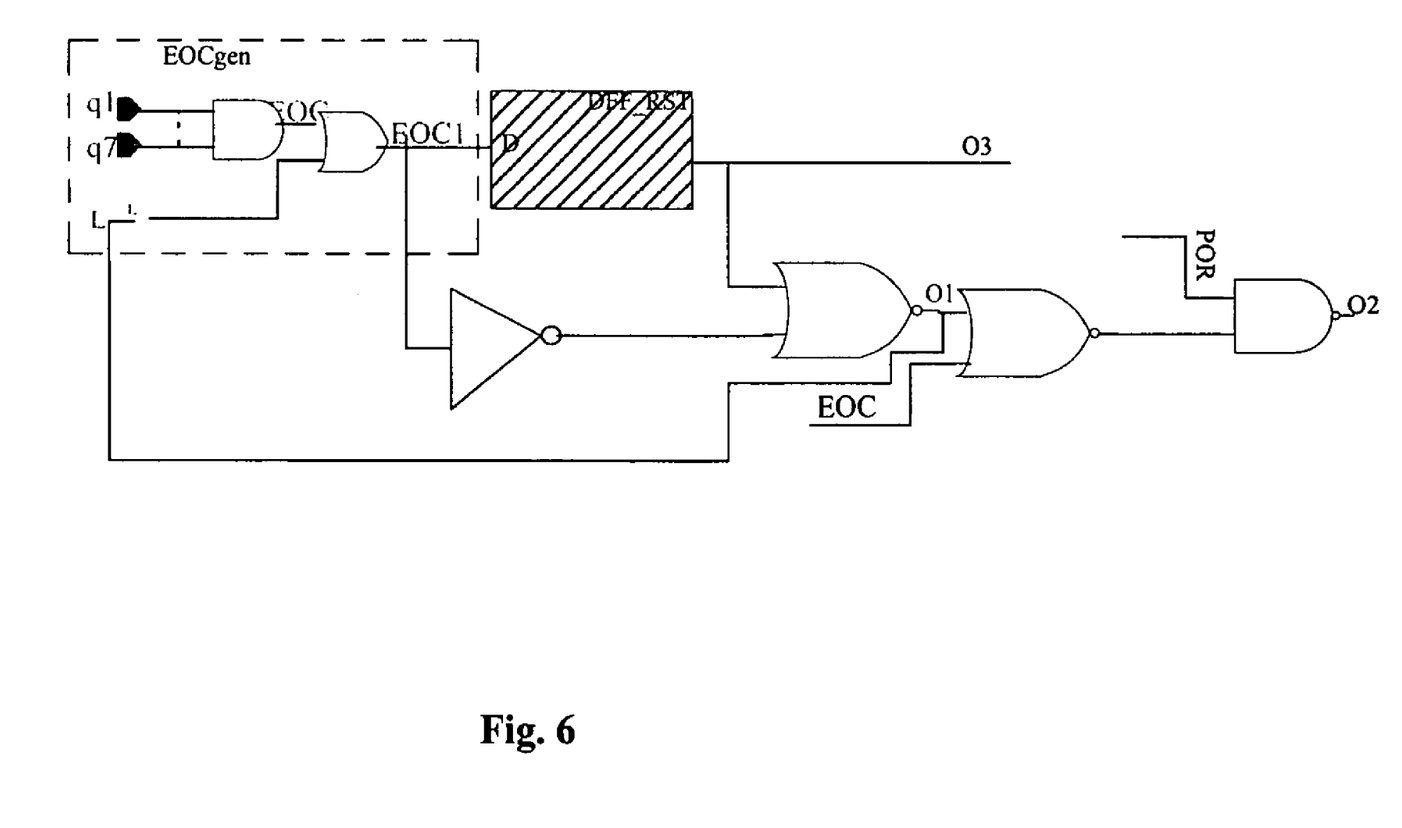
FIG. 6 shows the circuit of the Load generator shown in FIG. 1.

FIG. 6 expands the load generator 13. As soon as the End Of Count EOC signal is generated, the LOAD pulse O2 goes high, which initiates reloading of data in the synchronous down counter 11. As explained in the last section, the EOC signal is generated one clock pulse early. Hence the new data to be loaded should remain loaded for one complete clock cycle. In other words counting should start after a gap of one clock cycle. This is taken care by keeping Load pulse high for one clock cycle. In order to keep Load signal high for one clock pulse, interlocking is done with the EOC1 signal generated in EOC generator block. Note that as soon as EOC goes high, EOC1 also goes high. This makes LOAD1 signal in the load generator high. This LOAD1 signal remains high for one clock pulse. Now LOAD1 signal is further interlocked with EOC and POR, which generates final LOAD signal O2 for the synchronous down counter 11. The output of the D Flip Flop (which is preset) in the load generator 13 is given as an input to the T Flip Flop 14, which generates the final divided clock.

Figure 7:
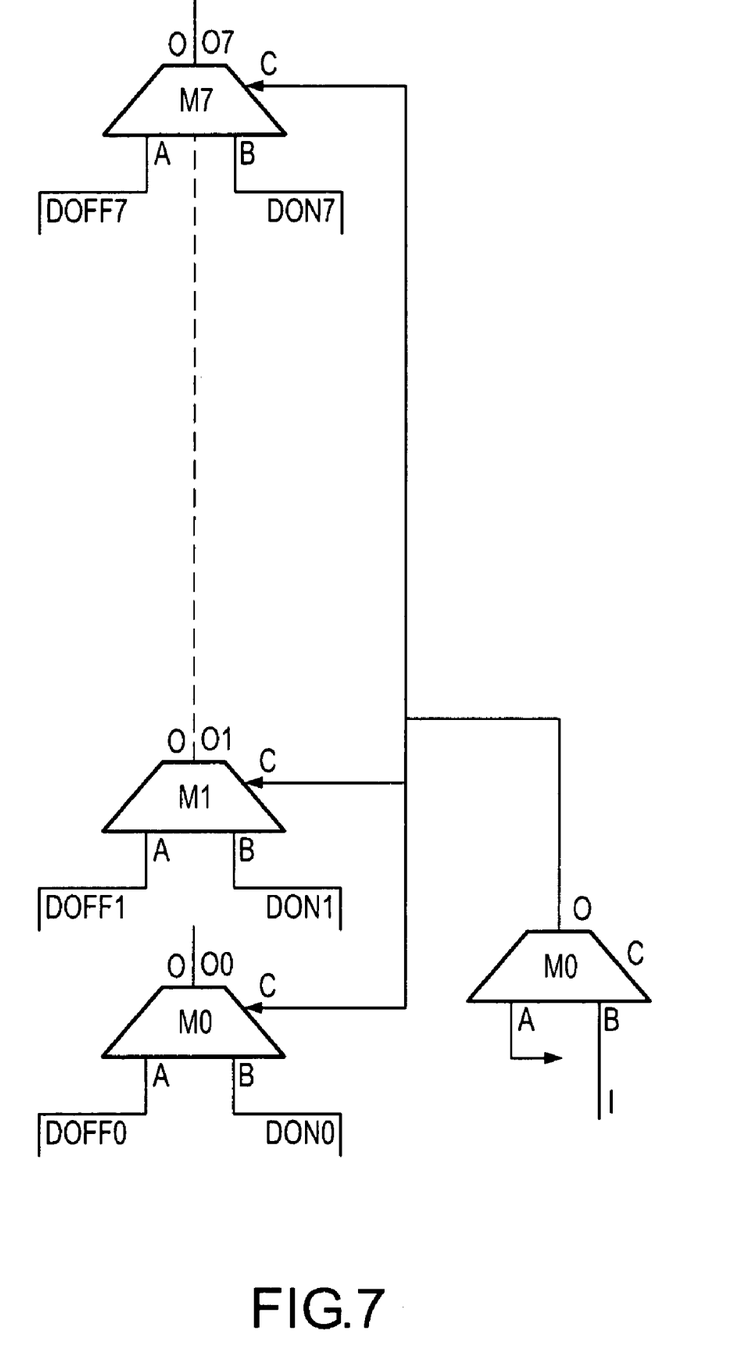
FIG. 7 shows the circuit of the Data Select Block shown in FIG. 1.

FIG. 7 describes the Data Select Block 15 that passes the data (DON or DOFF) to the synchronous down counter 11. It comprises of a series of multiplexers M0 to M7 for providing the outputs O0 to O7. The multiplexers M0 to M7 are controlled by the output of multiplexer M8, which in turn is coupled to the control terminal of each multiplexer M0 to M7.

Having described the construction of the circuit, elaboration on its working follows. The programmable frequency divider contains a down counter, which counts the pulses equivalent to the count loaded at its input by the data select block 15 at the rising and falling edges of the input clock CKIN. Once the End Of Count is reached, the T flip-flop flips its state and the whole procedure is repeated.

Figure 9:
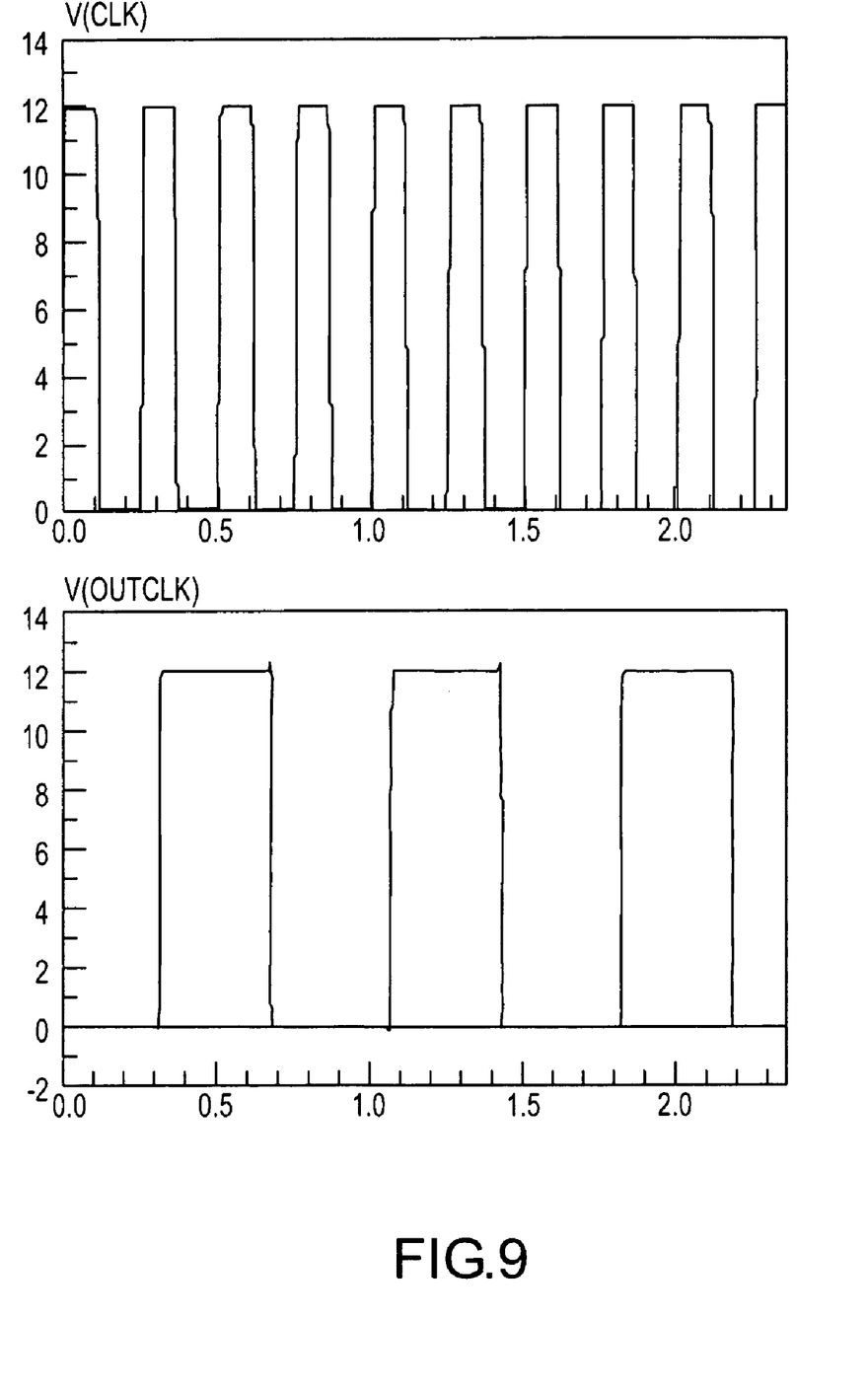
FIG. 9 shows the waveforms of normal division according to the present invention.

The circuit as shown in FIG. 1 works in two modes namely, the normal mode and the fractional mode. In the normal mode, the dividing factor 'N' present at the DON input terminals of the data select block 15 is passed on to the synchronous down counter 11. The down counter counts 'N' pulses of the clock at its input, which is double the frequency of the input clock (as the pulses are generated at the rising and falling edge of the input clock pulse). Thus effectively it counts (N/2) input clock pulses. The output clock CLKDIV flips after every (N/2) clock pulses resulting in an output frequency that is input frequency divided by N. It gives the output with 50% duty cycle if the input clock is having 50% duty cycle. FIG. 9 illustrates the waveforms of normal mode division taking divide by three as an example.

Figure 8:
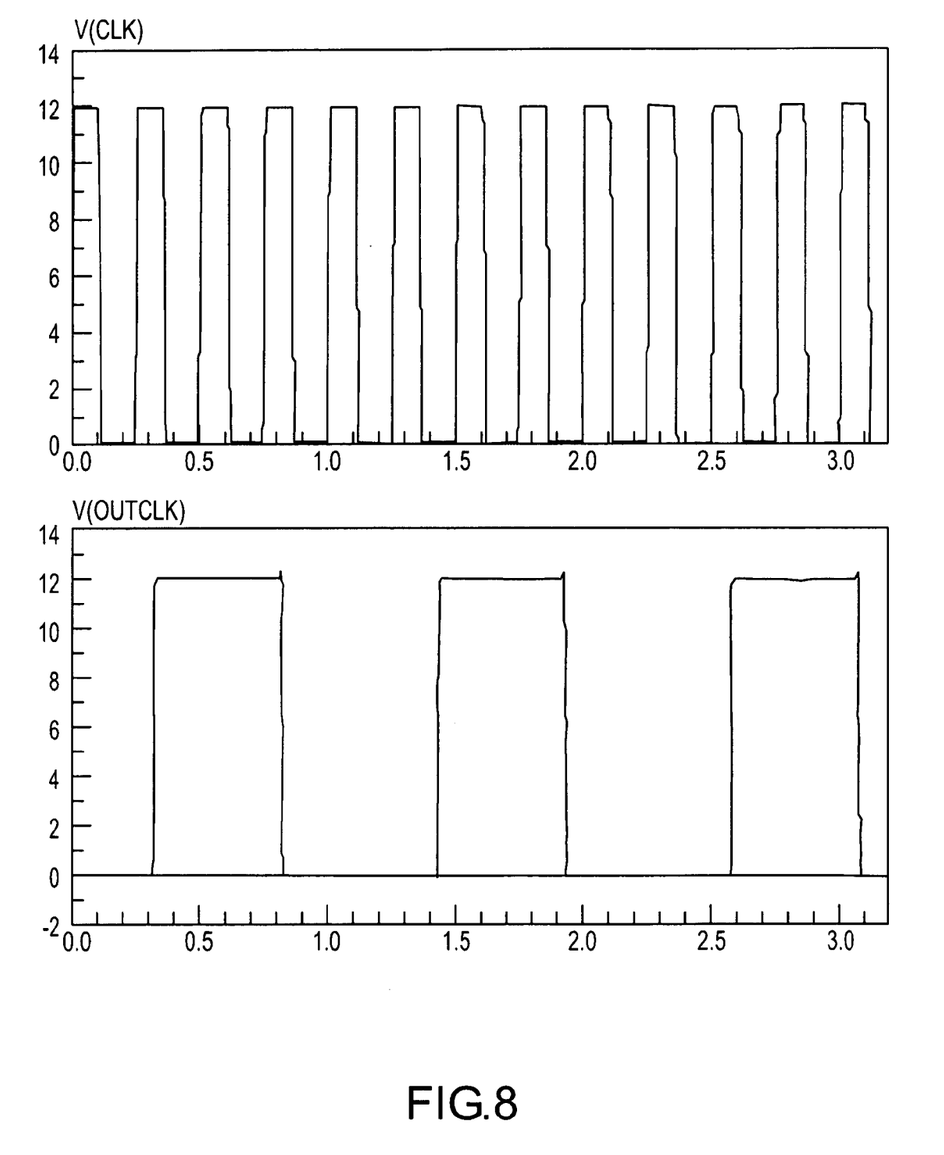
FIG. 8 shows the waveforms for fractional division according to the present invention.

In the fractional mode, the counter counts M pulses corresponding to output high and N pulses corresponding to output low. Thus the output remains high for (M/2) input clock period and low for (N/2) input clock period. Overall the period of the divided output is equal to (M+N)/2 input clock period. If (M+N) is odd the fractional division is achieved. While in case of fractional mode, the data to be passed depends on the state of the output of synchronous down counter 11 i.e. if the output clock is high DOFF will be passed to the counter for next counting. Similarly if output clock is low DON will be passed to the counter (remember the data is loaded only when the Load pulse is high). FIG. 8 illustrates the waveforms of normal mode division taking divide by three as an example.

The disclosed embodiment is exemplary only. The same approach might be used for up counting as well where the comparator for comparing the count value against the final count is used. Also if frequency of operation is low, the EOC signal is generated by the AND gate 40 when the output of the synchronous down counter 11 is zero. In such a case, the EOC signal acts as a load signal and Such embodiments and optimizations are within the scope and spirit of this invention.

While there have been described above the principles of the present invention in conjunction with specific memory architectures and methods of operation, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicant hereby reserves the right to formulate new claims to such features and/or combinations of such features during the prosecution of the present application or of any further application derived therefrom.

We claim:

1. A programmable frequency divider comprising:
   a data select block for loading on and off counts;
   a counter receiving input from said data select block for counting said counts;
   a pulse generator coupled to said counter for generating an output clock with greater frequency than an input clock;
   a detection means coupled to said counter for detecting a count value;
   a load generator coupled to said detection circuit for generating load signals for said counter and said detection circuit; and
   a flip-flop coupled to said load generator for providing a final output and for providing a feedback input to the data select block.

2. A programmable frequency divider as claimed in claim 1 wherein said data select block comprises a plurality of multiplexers.

3. A programmable frequency divider as claimed in claim 1 wherein said counter comprises a synchronous down counter.

4. A programmable frequency divider as claimed in claim 1 wherein said detection means comprises an end of count generator.

5. A programmable frequency divider as claimed in claim 1 wherein said counter comprises a synchronous up counter.

6. A programmable frequency divider as claimed in claim 1 wherein said detection means comprises a comparator.

7. A programmable frequency divider as claimed in claim 1 wherein said load generator comprises:
   a D flip flop coupled to a first output of said detection means;
   an inverter coupled to the first output of said detection means;
   a first gate coupled to an output of said D flip flop and said inverter;
   a second gate coupled to an output of said first gate and second output of said detection means; and
   a third gate coupled to an output of said second gate and a reset signal.

8. A programmable frequency divider as claimed in claim 5 wherein said first gate comprises a NOR gate.

9. A programmable frequency divider as claimed in claim 5 wherein said second gate comprises a NOR gate.

10. A programmable frequency divider as claimed in claim 5 wherein said third gate comprises a NAND gate.

11. A method for dividing a frequency of an input signal comprising:

providing a first count value and a second count value;
generating a second signal of higher frequency than the input signal;
applying said second signal to a counter;
loading said counter with said first count value;
detecting a first event when said counter counts a number of pulses of said second signal equal to said first count value;
toggling the output signal on the detection of said first event;
loading said counter with said second count value;
detecting a second event when said counter counts a number of pulses of said second signal equal to said second count value; and
toggling the output signal on the detection of said second event, thereby providing a divided output signal.

12. The method of dividing a frequency of an input signal as in claim 11, wherein the frequency of said clock signal comprises an even integral multiple of the frequency of said input signal.

13. The method for dividing a frequency of an input signal as claimed in claim 11, wherein said clock signal is generated by generating pulses on rising and falling edges of said input signal.

14. A method for dividing a frequency of a high frequency input signal comprising:
providing a first count value and a second count value;
generating a second signal of higher frequency than the input signal;
applying said second signal to a counter;
loading said counter with said first count value;
detecting a first event when said counter counts a number of pulses of said second signal is less/greater than the first count value by one;
loading said counter with said second count value;
toggling the output signal one clock cycle after the detection of said first event;
initiating counting of said second count value;
detecting a second event when said counter counts a number of pulses of said second signal is less/greater than the second count value by one; and
toggling the output signal after the detection of said second event, thereby providing a divided output signal.

15. The method of dividing a frequency of an input signal as in claim 14, wherein the frequency of said clock signal comprises an even integral multiple of the frequency of said input signal.

16. The method for dividing a frequency of an input signal as claimed in claim 14, wherein said clock signal is generated by generating pulses on rising and falling edges of said input signal.

17. A programmable frequency divider comprising:
a data select block for loading on and off counts;
a counter receiving input from said data select block for counting said count;
a pulse generator coupled to said counter for generating an output clock with greater frequency than a input clock;
circuitry coupled to said counter for detecting a count value;
a load generator coupled to said detection circuit for generating load signals for said counter and said detection circuit; and
a logic circuit coupled to said load generator for providing a final output and for providing a feedback input to the data select block.

18. A programmable frequency divider as claimed in claim 17 wherein said circuitry coupled to said counter comprises an end of count generator.

19. A programmable frequency divider as claimed in claim 17 wherein said circuitry coupled to said counter comprises a comparator.

* * * * *